United States Patent
Nakagawa (10) Patent No.: US 6,735,126 B1
(45) Date of Patent: May 11, 2004

(54) SEMICONDUCTOR MEMORY

(75) Inventor: Harunobu Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/155,997

(22) Filed: May 29, 2002

(30) Foreign Application Priority Data

Nov. 8, 2001 (JP) ........................................ 2001-342792

(51) Int. Cl.[7] .............................................. G11C 16/04
(52) U.S. Cl. ........................... 365/185.29; 365/185.12; 365/185.33
(58) Field of Search ....................... 365/185.29, 185.11, 365/185.12, 185.33, 189.01, 189.04

(56) References Cited

U.S. PATENT DOCUMENTS

| | | | | |
|---|---|---|---|---|
| 5,355,347 A | * | 10/1994 | Cioaca | 365/230.08 |
| 5,844,843 A | * | 12/1998 | Matsubara et al. | 365/185.24 |
| 6,178,129 B1 | * | 1/2001 | Chen | 365/206 |
| 6,512,702 B1 | * | 1/2003 | Yamamura et al. | 365/185.33 |
| 2002/0026607 A1 | * | 2/2002 | Takahashi et al. | 714/718 |

* cited by examiner

*Primary Examiner*—Gene Auduong
(74) *Attorney, Agent, or Firm*—Arent Fox PLLC (57) ABSTRACT

A plurality of memory blocks including a plurality of memory regions as minimum erase units is formed. When an erase control signal supplied in response to an erase command indicates a first erase mode, an erase selecting circuit selects all of the memory regions in the memory block selected by a first address signal. An erase control circuit erases data of the memory regions selected by the erase selecting circuit. Namely, erasure of the data is carried out by the memory block when the erase control signal indicates the first erase mode. Since the memory regions from which the data are erased can be selected simultaneously by one erase command, it is possible to reduce the number of input of erase commands. Therefore, it is possible to simplify a system program to be carried out by a CPU or the like which controls a semiconductor memory.

9 Claims, 6 Drawing Sheets

SEMICONDUCTOR MEMORY

BACKGROUND OF THE INVENTION

1. Field of the Invention

The present invention relates to an electrically rewritable nonvolatile semiconductor memory.

2. Description of the Related Art

A nonvolatile semiconductor memory such as a flash memory is capable of carrying out erase operation by an entire chip or by a sector.

Figure 1:
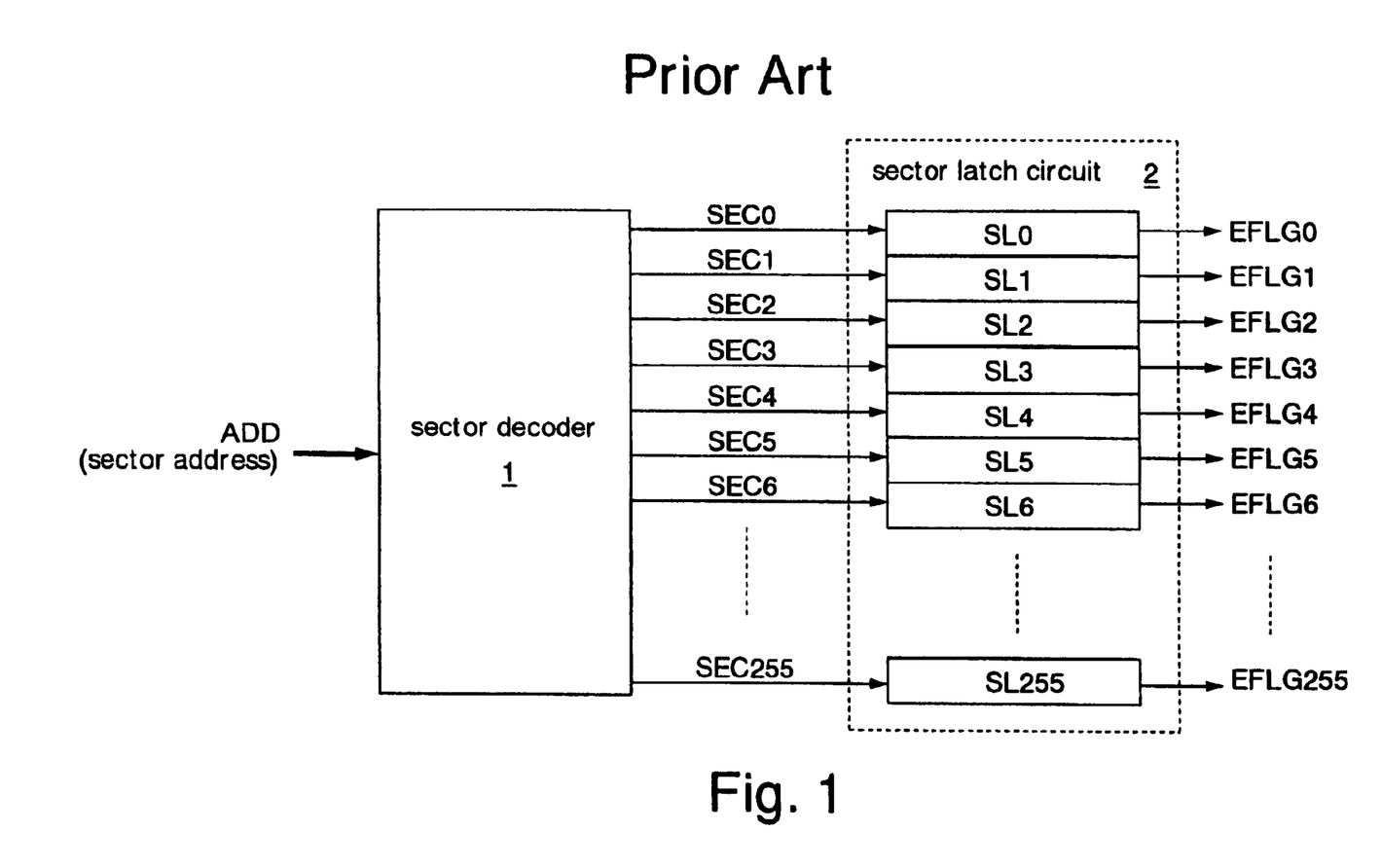
FIG. 1 is a block diagram showing a control circuit of a conventional semiconductor memory.

FIG. 1 shows an example of a control circuit inside the semiconductor memory for erasing data by the sector. A sector decoder 1 activates any of sector selecting signals SEC0 to SEC255 according to address signals ADD (sector address). A sector latch circuit 2 includes latches SL0 to SL255 for latching the respective sector selecting signals SEC0 to SEC255 and outputting the latched signals as erase flag signals EFLG0 to EFLG255. The latches SL0 to SL255 are formed corresponding to sectors of a memory array (not shown), respectively. The sectors corresponding to the erase flag signals EFLG0 to EFLG255 which are activated according to the sector selecting signals SEC0 to SEC255 are selected, and the data in these sectors are erased.

Figure 2:
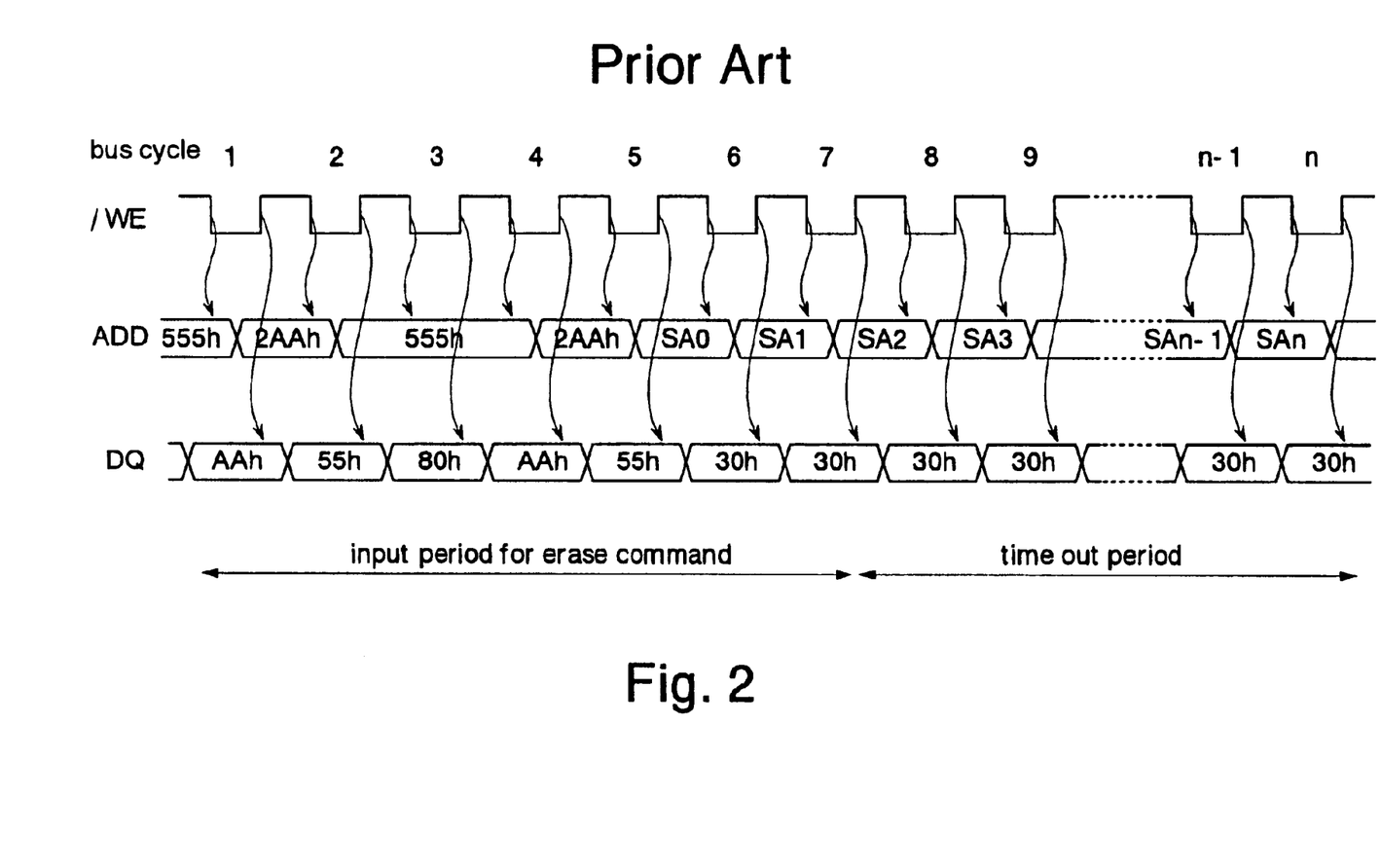
FIG. 2 is a timing chart showing the operation of erasing data by a sector in the conventional semiconductor memory.

FIG. 2 shows the operation of erasing the data by the sector. In this example, the address signals ADD and data signals DQ are inputted in synchronization with a write enable signal /WE.

First, 555h ("h" indicates hexadecimal number) is supplied to the address signals ADD and AAh is supplied to the data signals DQ in a first bus cycle, and 2AAh is supplied to the address signals ADD and 55h is supplied to the data signals DQ in a second bus cycle so that an internal circuit of the flash memory is activated. Next, when 555h is supplied to the address signals ADD and 80h is supplied to the data signals DQ in a third bus cycle, the flash memory identifies that an erase command is supplied thereto, and starts the operation of the control circuit which controls the erase operation.

Thereafter, 555h and 2AAh are sequentially supplied to the address signals ADD, and AAh and 55h are sequentially supplied to the data signals DQ in fourth and fifth bus cycles. In erasing the sector, 30h (indicating the supply of a sector address SA) is supplied to the data signals DQ in a sixth bus cycle. At this time, the address signals ADD are supplied as a sector address SAO from which the data are erased. The sector decoder 1 shown in FIG. 1 decodes the sector address SA. The sector latch circuit 2 latches the sector selecting signal SEC (any of SEC0 to SEC255) outputted from the sector decoder 1, and activates the erase flag signal EFLG.

In erasing a plurality of the sectors, the sector addresses SA and the data signals DQ (30h) are sequentially supplied in synchronization with the write enable signal /WE in and after a seventh bus cycle. The sector decoder 1 sequentially decodes the sector addresses SA, similarly to the above. The sector latch circuit 2 successively latches the sector selecting signals SEC (any of SEC0 to SEC255) outputted from the sector decoder 1, and activates the erase flag signals EFLG. Then, the erase operation is started after a predetermined period from the last-supplied command (sector address) so that the data of the sector which corresponds to the activated erase flag signal EFLG in the sector latch circuit 2 is erased. It should be mentioned that the first to sixth bus cycles are referred to as an input period for erase command and a period from the seventh bus cycle to the start of the erase operation is referred to as a time out period. Incidentally, when 10h is supplied to the data signals DQ in the sixth bus cycle, the flash memory carries out chip batch erasure for erasing the data of all the sectors after a predetermined period.

In order to erase the data of a plurality of the sectors in a conventional flash memory, it is necessary to input the sector addresses indicating the sectors one by one. It is apparent that in the future, the number of sectors increases as a storage capacity of the semiconductor memory such as the flash memory increases. For example, supposing that a capacity of one sector is 64k byte, the number of sectors of the 8M-bit (1M-word×8-bit) flash memory becomes 16. However, in the 256M-bit (32M-word×8-bit) flash memory, the number of the sectors becomes 512. In this case, for example, in selecting the 200 sectors from which the data are erased, the 200 bus cycles are necessary. Thus, when a memory capacity increases in the future, a time out period of great length is required in order to erase the data of a plurality of the sectors. When the number of the bus cycles for specifying the sectors from which the data are erased increases, a load of a system increases in instructing the semiconductor memory to carry out the erase operation. Further, a system program to be carried out by a CPU or the like which controls the semiconductor memory is complicated.

SUMMARY OF THE INVENTION

It is an object of the present invention to efficiently select a plurality of memory regions as minimum units for erasing data in a semiconductor memory having electrically rewritable nonvolatile memory cells.

It is another object of the present invention to reduce the load of a system for controlling the semiconductor memory and to simplify a control program.

According to one of the aspects of the semiconductor memory of the present invention, the semiconductor memory includes a plurality of memory blocks each having a predetermined number of memory regions being minimum erase units for erasing data. The respective memory regions include electrically rewritable nonvolatile memory cells. An erase selecting circuit selects all of the memory regions in one of the memory blocks selected by a first address signal supplied with an erase control signal, when the erase control signal supplied in response to an erase command indicates a first erase mode. An erase control circuit erases data of the memory regions selected by the erase selecting circuit. Namely, erasure of the data is carried out by the memory block when the erase control signal indicates the first erase mode. Since a plurality of the memory regions from which the data are erased can be selected simultaneously by one erase command, it is possible to reduce the number of input of the erase commands. Therefore, it is possible to simplify a system program to be carried out by a CPU or the like which controls the semiconductor memory. Further, since the number of cycles for selecting the memory regions from which the data are erased (input period for erase command) is reduced, it is possible to reduce the load of a system for instructing the semiconductor memory to carry out erase operation.

According to another aspect of the semiconductor memory of the present invention, the erase selecting circuit selects any one of the memory regions corresponding to a second address signal supplied with the erase control signal, when the erase control signal indicates a second erase mode. The erase control circuit erases the data of one memory region selected by the erase selecting circuit. Since the first or second erase mode is identified by the erase control signal, the memory regions to be erased can be selected by the memory block or by the memory region according to the erase control signal. As a result, the memory regions from which the data are erased can be selected efficiently with the smaller number of cycles.

According to another aspect of the semiconductor memory of the present invention, when the erase control signal changes a plurality of times in response to the erase command, the erase selecting circuit sequentially selects all of the memory regions or one of the memory regions in the selected memory block according to the change of the erase control signal. Thereafter, the erase control circuit erases data of the memory regions selected by the erase selecting circuit. Hence, all of the memory regions from which the data should be erased can be selected simultaneously by one erase command, and the data of these memory regions can be erased. The system which controls the semiconductor memory supplies, for example, the erase control signal of a low level to the semiconductor memory when selecting all the memory regions in the selected memory block, and supplies the erase control signal of a high level to the semiconductor memory when selecting one memory region. Thus, since the memory regions or the memory blocks can be selected freely by only changing the erase control signal, it is possible to facilitate erase control of the semiconductor memory by the system.

According to another aspect of the semiconductor memory of the present invention, the erase selecting circuit includes a latch circuit for setting erase flags corresponding to the memory regions from which the data are erased. The erase flags are set according to the first or second address signal which is sequentially supplied with the erase control signal corresponding to the erase command. The erase control circuit erases the data of the memory regions according to the erase flags set in the latch circuit. Hence, information (the first and second address signals indicating the memory regions from which the data are erased) which is supplied over a plurality of the bus cycles can be easily held by the simple latch circuit. As a result, it is possible to reduce the size of the erase selecting circuit.

According to another aspect of the semiconductor memory of the present invention, the erase selecting circuit includes decoders. The decoders activate erase enable signals corresponding to all of the memory regions in the selected memory block, respectively, selected by the first address signal when the erase control signal indicates the first erase mode. Further, the decoders activate one of the erase enable signals corresponding to one of the memory regions selected by the second address signal when the erase control signal indicates the second erase mode. The latch circuit is set according to the erase enable signals being activated. The decoders can be formed as simply as a normal address decoder. Besides, it is possible to share a part of an address decoder which is used in another circuit. As a result, the erase enable signals for setting the latch circuit can be easily formed. The size of the erase selecting circuit can be further reduced.

According to another aspect of the semiconductor memory of the present invention, the erase control circuit starts erase operation on the selected memory regions after a predetermined period from last input of the first or second address signal. In other words, the erase operation is started when the first or second address signal is not inputted for a predetermined period. Hence, the number of cycles for selecting the memory regions from which the data are erased becomes arbitrary. Thus, since the start of the erase operation is made to be variable according to the number of cycles required for selecting the memory regions from which the data are erased, it is possible to optimize a period from the erase command to completion of the erase operation at all times.

According to another aspect of the semiconductor memory of the present invention, the erase control signal is supplied as a third address signal of one bit. The erase operation is carried out while regarding the memory region including a plurality of memory cells as the minimum unit. For this reason, bit numbers of the address signals required for the erase operation are always smaller than bit numbers of the address signals required for read operation or write operation. One bit (the third address signal) out of the address signals used only in the read operation or the write operation is used as the erase control signal in the erase operation, thereby preventing the number of external terminals from increasing. As a result, it is possible to prevent the chip size of the semiconductor memory from increasing.

According to another aspect of the semiconductor memory of the present invention, the first and second address signals are supplied through different address terminals, respectively. Hence, a circuit for separating the first and second address signals becomes unnecessary in the semiconductor memory. As a result, it is possible to reduce the circuit size of the semiconductor memory. Further, in the system for controlling the semiconductor memory, a synthesizing circuit for outputting the first and second address signals from a common terminal becomes unnecessary.

According to another aspect of the semiconductor memory of the present invention, at least a part of the first and second address signals are supplied through same address terminal(s). Hence, it is possible to reduce the number of signal lines for transmitting the first and second address signals to the erase selecting circuit in the semiconductor memory. Since the layout area of the signal lines for transmitting the address signals is reduced, it is possible to reduce the chip size of the semiconductor memory.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Hereinafter, a preferred embodiment of the present invention will be explained with reference to the drawings.

Figure 3:
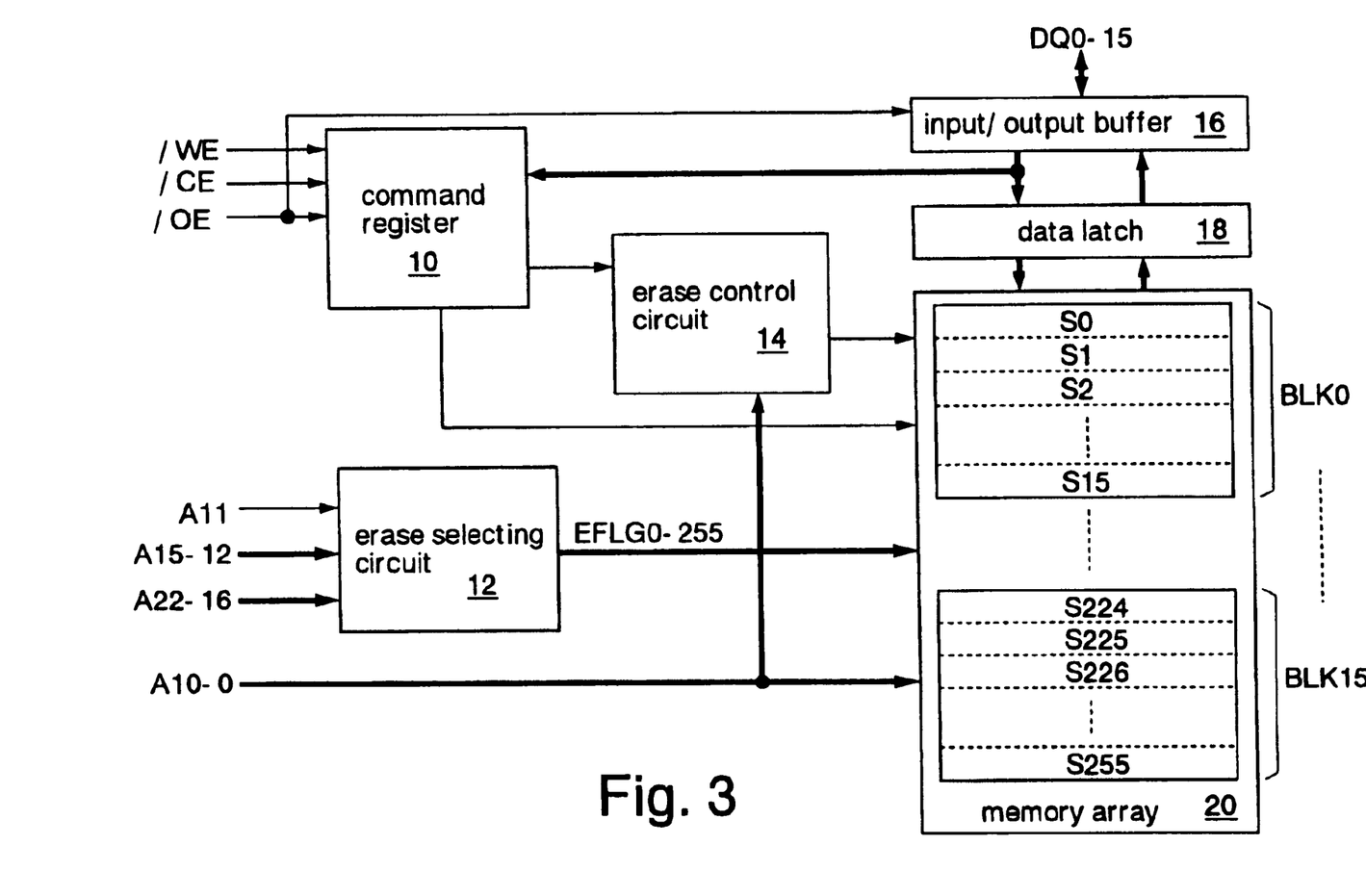
FIG. 3 is a block diagram showing an embodiment of a semiconductor memory according to the present invention.

FIG. 3 shows an embodiment of a semiconductor memory according to the present invention. The same numerals and symbols are given to designate the same circuits and signals as those explained in Description of the Related Art, and detailed explanations thereof will be omitted. Each of signal lines shown by bold lines consists of a plurality of lines.

This semiconductor memory is formed as a 128M-bit (8M words×16 bits) flash memory having electrically rewritable nonvolatile memory cells. 23-bit address signals A22 to A0 are supplied in order to identify address spaces of 8M words. Read operation and write operation are carried out by using the address signals A22 to A0, and erase operation is carried out by using the address signals A22 to A11.

The flash memory is mounted on, for example, a system substrate of a cellular phone and the like, together with a controller such as a CPU. Access to the flash memory (read operation, write operation and erase operation) is obtained by means of a control program which is carried out by the CPU. Incidentally, the flash memory may be a unit device, or a memory core formed in a system LSI or the like. The flash memory includes a command register 10, an erase selecting circuit 12, an erase control circuit 14, an input/output buffer 16, a data latch 18, and a memory array 20.

When a chip enable signal /CE is activated, the command register 10 receives data signals DQ0 to DQ15 (commands) in synchronization with a write enable signal /WE, and outputs control signals for controlling the erase control circuit 14 and the memory array 20 according to the received commands. It should be mentioned that the first symbol "/" of the signal names indicates the negative logic.

The erase selecting circuit 12 receives the 1-bit address signal A11 (erase control signal), the 4-bit address signals A15 to A12 (first address signal) and the 8-bit address signals A22 to A16 (second address signal), and outputs erase flag signals EFLG0 to EFLG255 corresponding to the received address signals. The erase flag signals EFLG0 to EFLG255 are corresponding to later-described sectors S0 to S255, respectively, and indicate the sectors from which data are erased.

The erase control circuit 14 outputs a control signal for erasing data of the memory cells according to the address signals A10 to A0 and the control signal being outputted from the command register 10 and indicating the erase operation. When an output enable signal /OE is at a low level, the input/output buffer 16 outputs data held in the data latch 18 to the external as the data signals DQ0 to DQ15, and when the output enable signal /OE is at a high level, it supplies the data signals DQ0 to DQ15 from the external to the command register 10 and the data latch 18. The data latch 18 outputs the data supplied from the input/output buffer 16 to the memory array 20 during the write operation, and outputs data read from the memory array 20 to the input/output buffer 16 during the read operation.

The memory array 20 includes 16 memory blocks BLK0 to BLK15. Each of the memory blocks BLK0 to BLK15 includes the 16 sectors S0 to S15 (or S16 to S31, S32 to S47, . . . , S224 to S255). Capacities of each memory block BLK and sector S are 1M words×16 bits and 64k words×16 bits, respectively. Each of the sectors S0 to S255 is a minimum unit (memory region) for erasing the data written in the memory cells. The memory array 20 includes a decoder (not shown) for decoding the address signals A10 to A0.

Figure 4:
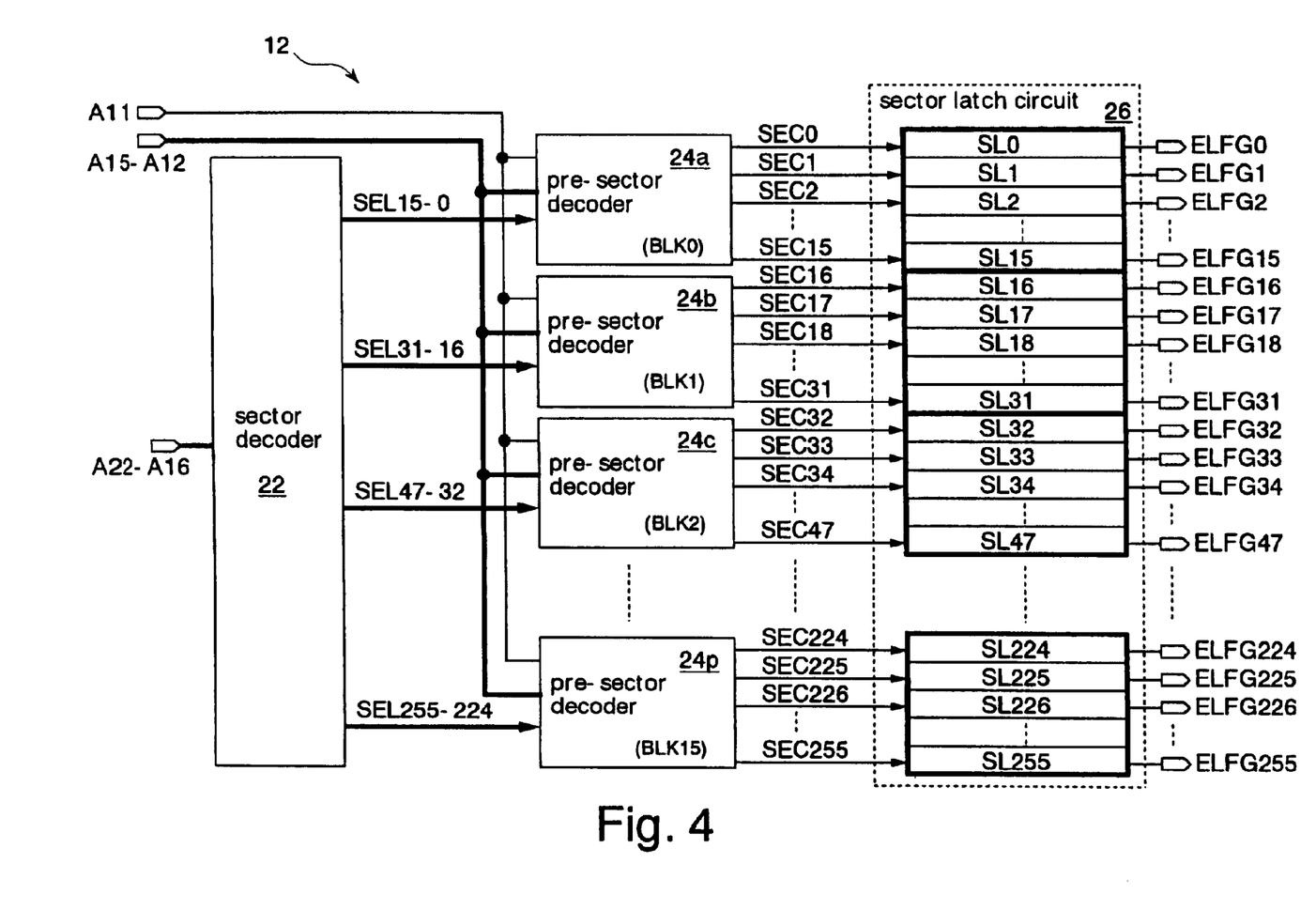
FIG. 4 is a block diagram showing the details of an erase selecting circuit in FIG. 3.

FIG. 4 shows the details of the erase selecting circuit 12 shown in FIG. 3. The erase selecting circuit 12 includes a sector decoder 22, 16 pre-sector decoders 24a to 24p which correspond to the memory blocks BLK0 to BLK15, respectively, and a sector latch circuit 26. The sector decoder 22 decodes the address signals A22 to A16, thereby activating any of erase selecting signals SEL0 to SEL255.

When the address signal A11 is at a low level (first erase mode) and levels of the address signals A15 to A12 are "0000", the pre-sector decoder 24a activates all of erase enable signals SEC0 to SEC15 (high levels). Further, when the address signal A11 is at a high level (second erase mode), the pre-sector decoder 24a activates any of the erase enable signals SEC0 to SEC15 in response to activation of any of the erase selecting signals SEL0 to SEL15.

When the address signal A11 is at the low level and the levels of the address signals A15 to A12 are "0001", the pre-sector decoder 24b activates all of erase enable signals SEC16 to SEC31 (high levels). Further, when the address signal A11 is at the high level, the pre-sector decoder 24b activates any of the erase enable signals SEC16 to SEC31 in response to activation of any of erase selecting signals SEL16 to SEL31.

The pre-sector decoders 24c to 24p are the same as the pre-sector decoders 24a and 24b, except that the erase selecting signals SEL to be received, the erase enable signals SEC to be outputted, and the logic levels of the address signals A15 to A12 for activating all of the erase enable signals SEC are different.

The sector latch circuit 26 includes 256 latches SL0 to SL255 corresponding to the respective sectors S0 to S255. The respective latches SL0 to SL255 are set in response to activation (high levels) of the erase enable signals SEC0 to SEC255, and output the erase flag signals EFLG0 to EFLG255 at high levels. The sector latch circuit 26 operates as a latch circuit for setting the erase flags corresponding to the sectors S from which the data are erased.

Figure 5:
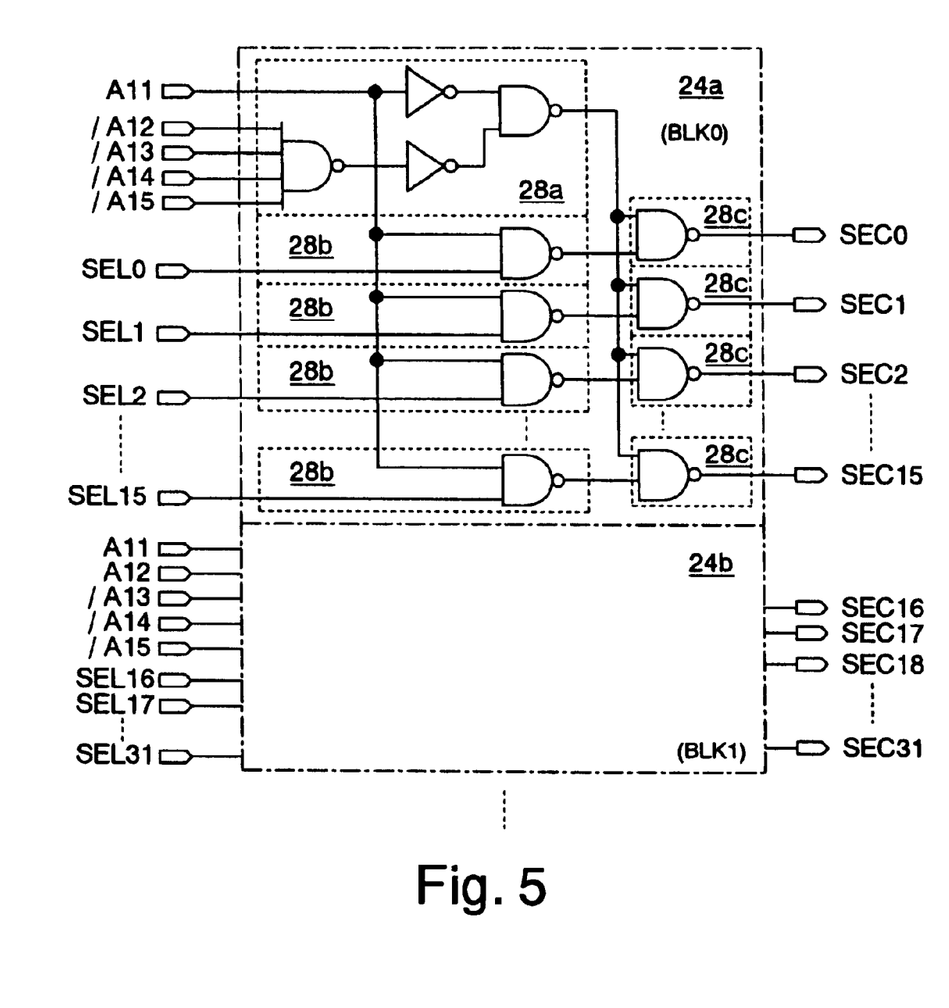
FIG. 5 is a circuit diagram showing the details of a pre-sector decoder in FIG. 4.

FIG. 5 shows the details of the pre-sector decoder 24a shown in FIG. 4. The pre-sector decoders 24b to 24p are the same circuits as the pre-sector decoder 24a, and hence illustrations thereof will be omitted.

The pre-sector decoder 24a includes a decoder 28a which operates when the address signal A11 is at the low level and decodes "0000" of the address signals A15 to A12, a plurality of decoders 28b which operate when the address signal A11 is at the high level and invert respective logic levels of the erase selecting signals SEL0 to SEL15, and a plurality of OR gates 28c of the negative logic which receive respective outputs of the decoders 28a and 28b and output the erase enable signals SEC0 to SEC15.

Figure 6:
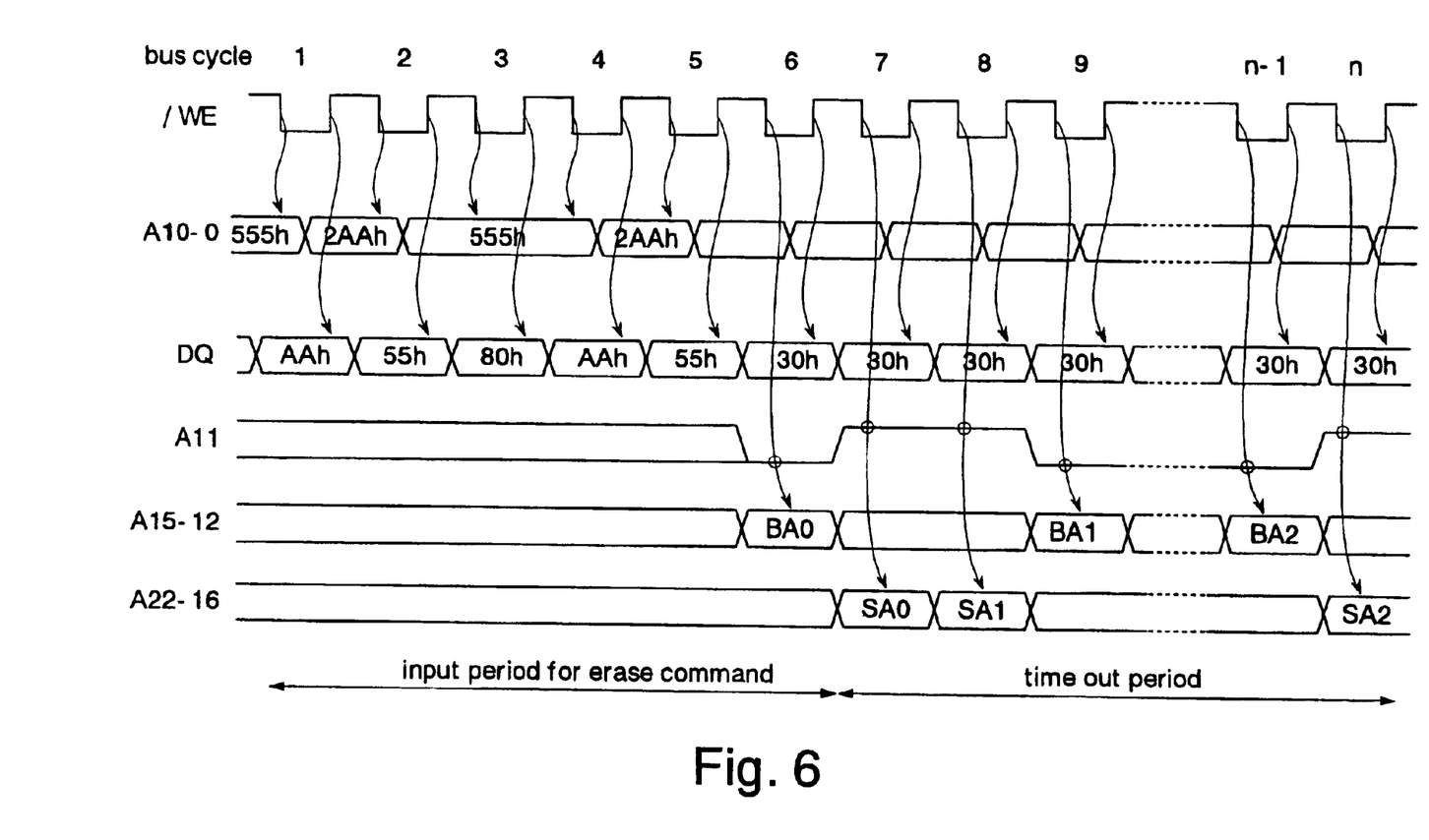
FIG. 6 is a timing chart showing the operation of erasing the data by the sector in the semiconductor memory according to the present invention.

FIG. 6 shows the operation of erasing the data by the sector in the above-described flash memory. Detailed explanations about the same operations, as those shown in FIG. 2 will be omitted. Similarly to FIG. 2, an input period for erase command is up to a sixth bus cycle, and a time out period is a period from a seventh bus cycle to start of the erase operation. In each bus cycle, the flash memory latches the address signals and the data signals in synchronization with a falling edge and a rising edge of the write enable signal /WE, respectively.

First to fifth bus cycles are the same as those shown in FIG. 2. Namely, in response to command inputs of the first and the second bus cycles, an internal circuit of the flash memory is activated. Next, in response to command inputs of the third bus cycle, the flash memory identifies that the erase command is supplied thereto, and starts the operation of the erase control circuit 14 (FIG. 3). Thereafter, in the fourth and fifth bus cycles, 555h and 2AAh are sequentially supplied to the address signals ADD, and AAh and 55h are sequentially supplied to the data signals DQ.

In and after the sixth bus cycle, the address signals A10 to A0 are not used but the address signals A22 to A11 are used. When the address signal A11 is at the low level (first erase mode), the address signals A15 to A12 become effective. At this time, a block address BA (BA0, BA1, BA2, ...) for selecting all the sectors S in the memory block BLK from which the data are erased is supplied as the address signals A15 to A12. Meanwhile, when the address signal A11 is at the high level (second erase mode), the address signals A22 to A16 become effective. At this time, a sector address SA (SA0, SA1, SA2, ...) for selecting one sector S from which the data are erased is supplied as the address signals A22 to A16. Thus, the address signal A11 functions as the erase control signal for selecting the erase mode during the erase operation, and functions as the normal address signal during the read operation and the write operation.

When the address signal A11 is at the low level, any of the decoders 28a of the pre-sector decoders 24a to 24p which are shown in FIG. 4 is activated, and the 16 erase enable signals SEC (for example, SEC0 to SEC15) are activated simultaneously. Then, the 16 latches SL of the sector latch circuit 26 are set, and the 16 erase flag signals EFLG (for example, EFLG0 to EFLG15) are activated simultaneously. When the address signal is at the high level, any of the decoders 28b of the pre-sector decoders 24a to 24p is operated, and any of the erase enable signals SEC0 to SEC255 is activated. Then, only one of the latches SL of the sector latch circuit 26 is set, and any of the erase flag signals EFLG0 to EFLG255 is activated.

According to this embodiment, when, for example, the data of the sectors S0 to S39 are erased, only two bus cycles and eight bus cycles are necessary to select the memory blocks BLK0 and BLK1 and the sectors S32 to S39, respectively. Meanwhile, in the conventional art, 40 bus cycles, whose number is the same as that of the sectors S0 to S39 to be erased, are necessary.

The erase control circuit 14 instructs the memory array 20 to start the erase operation after a predetermined period from the last-supplied command (sector address SA or block address BA) so that the data of the sector S which corresponds to the activated erase flag signal EFLG is erased. Incidentally, when 10h is supplied to the data signals DQ in the sixth bus cycle, the flash memory carries out chip batch erasure for erasing the data of all the sectors S after a predetermined period, irrespective of the address signals A22 to A11.

As described above, according to this embodiment, a plurality of the sectors S from which the data are erased are selected simultaneously when the address signal A11 is at the low level (first erase mode). Since a plurality of the sectors S from which the data are erased can be selected simultaneously by one erase command, it is possible to reduce an input number of the erase commands. Therefore, it is possible to simplify a system program to be carried out by the CPU or the like which controls the flash memory. Further, since the number of the bus cycles for specifying the sectors S from which the data are erased is reduced, it is possible to reduce a load of a system for instructing the flash memory to carry out the erase operation.

When the address signal A11 is at the high level (second erase mode), only one sector S from which the data is erased is selected. Hence, the address signal A11 is changed for a plurality of times corresponding to one erase command, thereby selecting all the sectors S from which the data should be erased by one erase command and erasing the data of these sectors S. Thus, since the sectors S can be selected freely only by changing the erase control signal, it is possible to facilitate the erase control of the semiconductor memory by the system.

The latches SL0 to SL255, which correspond to the respective sectors S0 to S255 are formed in the erase selecting circuit 12. The erase flags (erase flag signals EFLG0 to EFLG255) indicating the sectors S from which the data are erased are set in these respective latches SL0 to SL255. Further, the sector decoder 22 and the pre-sector decoders 24a to 24p are formed in the erase selecting circuit 12, for decoding the address signals A15 to A12 or the address signals A22 to A16, and setting the 16 latches SL corresponding to all of the sectors S in the memory block BLK or the latch SL corresponding to one sector S. Then, the data of a plurality of the sectors S are erased corresponding to the erase flag signals EFLG which are set in the latches SL. Hence, information about the sectors S to be erased (address signals A22 to A11) which is supplied over a plurality of the bus cycles can be identified by the simple decoder and held by the simple latch circuit. As a result of this, it is possible to reduce a circuit size of the erase selecting circuit 12.

The erase control circuit 14 instructs to start the erase operation on a plurality of the sectors S after a predetermined period from the last-supplied command (sector address SA or block address BA). Hence, the number of the bus cycles for selecting the sectors S from which the data are erased becomes arbitrary. Thus, since the start of the erase operation is made to be variable according to the bus cycles required for selecting the sectors S from which the data are erased, it is possible to optimize a period from the erase command to completion of the erase operation at all times.

Since the address signal A11 which is used only in the read operation or the write operation is used as the erase control signal during the erase operation, it is possible to prevent the number of external terminals from increasing. As a result of this, it is possible to prevent a chip size of the flash memory from increasing.

The address signals A15 to A12 (first address signal) for selecting the 16 sectors S simultaneously and the address signals A22 to A16 (second address signal) for selecting only one sector S are respectively supplied through different address terminals. Hence, a circuit for separating the address signals A15 to A12 from the address signals A22 to A16 becomes unnecessary in the flash memory. As a result of this, it is possible to reduce the circuit size of the flash memory. Further, in the system for controlling the flash memory, a synthesizing circuit for outputting the address signals A15 to A12 and the address signals A22 to A16 from the common terminal becomes unnecessary.

Incidentally, in the above-described embodiment, the example of receiving the address signals A15 to A12 (first address signal) and the address signals A22 to A16 (second address signal) for selecting the sectors S during the erase operation through the different address terminals is explained. The present invention is not limited to the above embodiment. For example, at least a part of the address signals A15 to A12 (first address signal) and the address signals A22 to A16 (second address signal) may be received through the same address terminal. In this case, it is possible to reduce the number of signal lines for transmitting these address signals to the erase selecting circuit 12 in the flash memory. Since the layout area of the signal lines of the address signals is reduced, it is possible to reduce the chip size of the flash memory.

The invention is not limited to the above embodiments and various modifications may be made without departing from the spirit and scope of the invention. Any improvement may be made in part or all of the components.

It is claimed:

1. A semiconductor memory comprising:

a plurality of memory regions each having electrically rewritable nonvolatile memory cells and being minimum erase units for erasing data written into the memory cells;

a plurality of memory blocks each including a predetermined number of said memory regions;

an erase selecting circuit for simultaneously selecting all of said memory regions in one of said memory blocks corresponding to a first address signal supplied with an erase control signal, when said erase control signal supplied in response to an erase command indicates a first erase mode; and an erase control circuit for erasing data of said memory regions selected by said erase selecting circuit.

2. The semiconductor memory according to claim 1, wherein said erase selecting circuit selects at least one of said memory regions corresponding to a second address signal supplied with said erase control signal, when said erase control signal indicates a second erase mode.

3. The semiconductor memory according to claim 2, wherein:

when said erase control signal changes a plurality of times in response to said erase command, said erase selecting circuit selects all of said memory regions and/or one of said memory regions in the selected memory block in sequence in which respective erase modes are indicated by said erase control signal; and said erase control circuit erases data of said memory regions selected by said erase selecting circuit.

4. The semiconductor memory according to claim 3, wherein said erase control circuit starts erase operation on the selected memory regions after a predetermined period from last input of said first or second address signal.

5. The semiconductor memory according to claim 2, wherein:

said erase selecting circuit includes a latch circuit for setting erase flags corresponding to said memory regions from which the data are erased according to said first or second address signal supplied with said erase control signal; and said erase control circuit erases the data of said memory regions according to said erase flags set in said latch circuit.

6. The semiconductor memory according to claim 5, wherein:

said erase selecting circuit includes decoders for activating erase enable signals corresponding to all of said memory regions in the selected memory block, respectively, selected by said first address signal when said erase control signal indicates said first erase mode, and for activating one of said erase enable signals corresponding to one of said memory regions selected by said second address signal when said erase control signal indicates said second erase mode; and said latch circuit is set according to said erase enable signals being activated.

7. The semiconductor memory according to claim 2, wherein said erase control signal is a third address signal of one bit.

8. The semiconductor memory according to claim 2, wherein said first and second address signals are supplied through different address terminals, respectively.

9. The semiconductor memory according to claim 2, wherein at least a part of said first and second address signals are supplied through same address terminal(s).

* * * * *